United States Patent
Torgerson et al.

(10) Patent No.: US 8,370,156 B1
(45) Date of Patent: Feb. 5, 2013

(54) EDITING SUGGESTIONS IN DIFFERENT FORMALISMS

(75) Inventors: Jay Ryan Torgerson, Hopkinton, MA (US); Xiaocang Lin, Wayland, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 437 days.

(21) Appl. No.: 12/690,560

(22) Filed: Jan. 20, 2010

(51) Int. Cl.
*G10L 21/00* (2006.01)
(52) U.S. Cl. .............................. 704/270; 704/1; 717/106
(58) Field of Classification Search .................. 717/106; 704/270
See application file for complete search history.

(56) References Cited

U.S. PATENT DOCUMENTS

| | | | | |
|---|---|---|---|---|
| 4,829,294 A | * | 5/1989 | Iwami et al. | 715/803 |
| 5,019,998 A | * | 5/1991 | Cowan et al. | 703/13 |
| 6,021,403 A | * | 2/2000 | Horvitz et al. | 706/45 |
| 6,173,438 B1 | * | 1/2001 | Kodosky et al. | 717/109 |
| 6,233,570 B1 | * | 5/2001 | Horvitz et al. | 706/11 |
| 7,475,235 B1 | * | 1/2009 | Bernardy et al. | 713/1 |
| 7,565,640 B2 | * | 7/2009 | Shukla et al. | 717/105 |
| 7,617,093 B2 | * | 11/2009 | Ramsey | 704/10 |
| 7,809,545 B2 | * | 10/2010 | Ciolfi et al. | 703/22 |
| 7,823,122 B1 | * | 10/2010 | Englehart | 717/106 |
| 7,886,269 B2 | * | 2/2011 | Williams et al. | 717/121 |
| 2007/0067761 A1 | * | 3/2007 | Ogilvie et al. | 717/146 |
| 2010/0281458 A1 | * | 11/2010 | Paladino et al. | 717/106 |

* cited by examiner

*Primary Examiner* — Justin Rider
(74) *Attorney, Agent, or Firm* — Nelson Mullins Riley & Scarborough LLP

(57) ABSTRACT

Exemplary embodiments enable generating and propagating editing suggestions for system representations implemented in different formalisms. Exemplary embodiments enable representation of one or more portions of an underlying system in different formalisms. Exemplary embodiments automatically generate suggestions for editing a particular representation based on an analysis of the particular representation, the formalism in which the particular representation is implemented, at least one other representation of the underlying system, and the formalism in which the at least one other representation is implemented. Exemplary embodiments also generate corresponding suggestions for editing at least one other representation of the underlying system based on an analysis of the at least one other representation and the formalism in which it is implemented.

50 Claims, 10 Drawing Sheets

Model editor      Code editor

EDITING SUGGESTIONS IN DIFFERENT FORMALISMS

BACKGROUND

Computing environments may provide different formalisms for representing one or more portions of a single underlying system. A formalism may provide a formal language in which a representation is implemented. For example, a formalism may include a set of formation rules that describe the syntax and semantics of the representation that are grammatical or valid within the formal language (e.g., by means of a grammar, enumeration, transformation, meta-model, etc.). Formalisms can be provided by, for example, different modeling environments (e.g., text-based modeling environment, graphical modeling environments), different languages for deployment computing instructions on different targets (e.g., for an embedded processor target, a field-programmable gate array (FPGA) target), different programming languages (e.g., C++, Java), etc.

A system may have multiple portions. A single portion of a system may be represented in different formalisms. For example, suppose a dynamic system includes a real-world object (e.g., a swinging pendulum). This real-world object may be represented by a graphical model presented in a model editor. In addition, this real-world object may be represented by code associated with the graphical model that is presented in a code editor. In this example, the model editor and the code editor present different formalisms that dictate the syntax and semantics of the two, different representations.

Similarly, different portions of a system may be represented in different formalisms. For example, a dynamic system may be represented by a model, and the model may be partitioned into two sub-models. One sub-model may be modeled for deployment as software on an embedded processor, and the other sub-model may be modeled for deployment on a field-programmable gate array (FPGA). In this example, the embedded processor target and the FPGA target may present different formalisms that dictate the syntax and semantics of the two different representations for two different portions of the system.

DETAILED DESCRIPTION

Overview of Exemplary Embodiments

Exemplary embodiments enable generating and propagating editing suggestions for system representations implemented in different formalisms. Exemplary embodiments enable representation of one or more portions of an underlying system in different formalisms. Exemplary embodiments automatically generate suggestions for editing a particular representation based on an analysis of the particular representation, the formalism in which the particular representation is implemented, at least one other representation of the underlying system, and the formalism in which the at least one other representation is implemented.

Exemplary embodiments also generate corresponding suggestions for editing at least one other representation of the underlying system based on an analysis of the at least one other representation and the formalism in which it is implemented. That is, the suggestions generated for each representation is dictated, in part, by the representation and the syntax and semantics of the formalism. As a result, it is possible that more types of suggestions are allowed in one representation than the other representations.

When a user accepts a suggestion in any representation, exemplary embodiments edit the representation based on the suggestion. Exemplary embodiments can also determine zero, one, or even more suggestions in each of the other representations that correspond to the accepted suggestion, and edit the other representations based on the corresponding suggestions.

Figure 1:
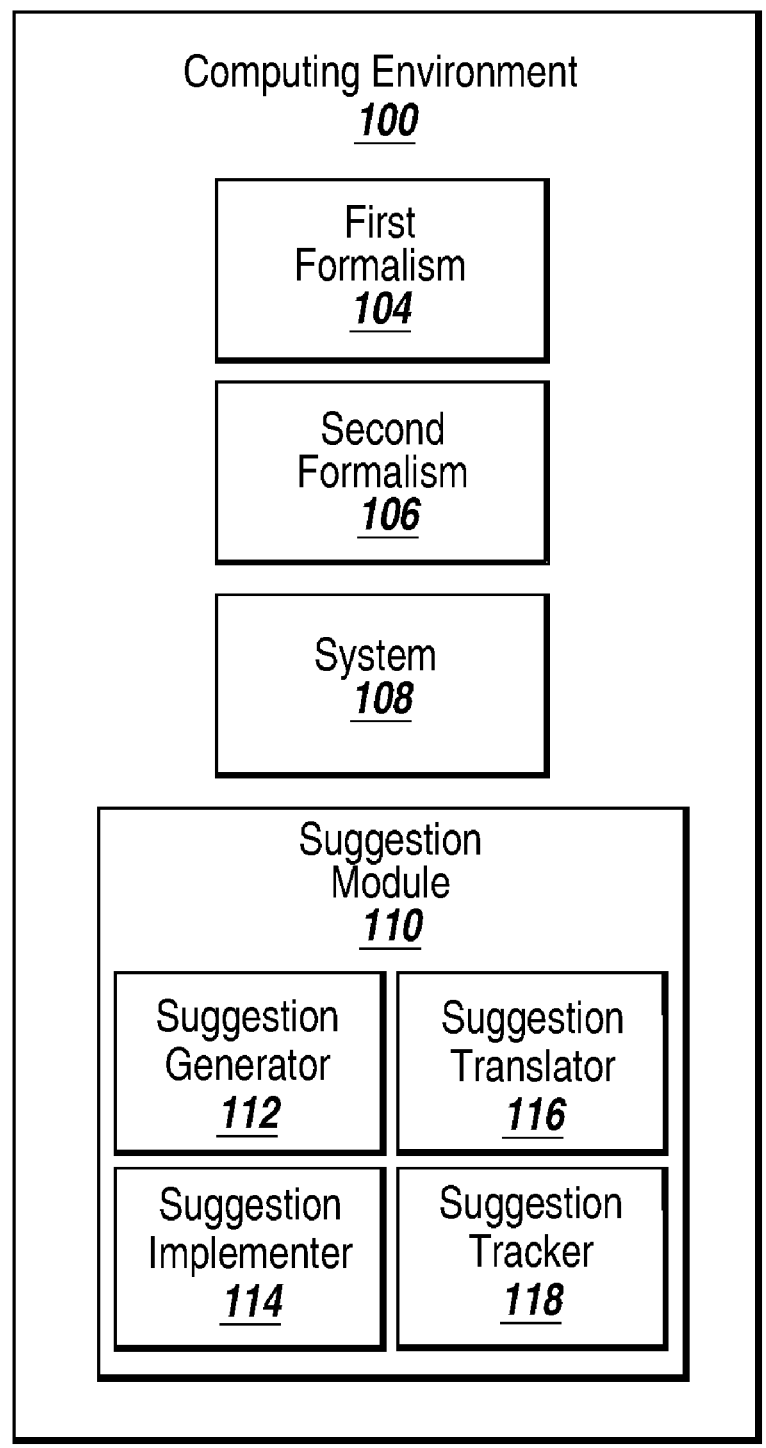
FIG. 1 illustrates a high-level block diagram of a computing environment in which exemplary embodiments may be provided.

FIG. 1 is a block diagram of an exemplary computing environment 100 that is configured or programmed to implement exemplary embodiments. The computing environment 100 may include two or more formalisms, e.g., a first formalism 104 and a second formalism 106. The computing environment 100 may also include an underlying system 108, e.g., a description of a dynamic real-world system like a swinging pendulum.

The computing environment 100 may also include a suggestion module 110 that can provide certain functionalities of exemplary embodiments. The suggestion module 110 includes a suggestion generator 112 which analyzes one or more representations of a system and one or more formalisms to automatically generate suggestions on editing the representations. The suggestion module 110 includes a suggestion translator 116 which automatically translates a set of suggestions for editing a representation into a corresponding set of suggestions for editing one or more other representations. The suggestion module 110 also includes a suggestion implementer 114 which automatically edits one or more representations based on one or more suggestions. The suggestion module 110 further includes a suggestion tracker 118 which tracks users' acceptance and/or rejection of suggestions.

Graphical Model and Code Example

Exemplary embodiments will now be described in reference to an example in which a single portion of an underlying system is represented as a graphical model implemented in a graphical modeling environment (e.g., a model editor) and as code associated with the graphical model implemented in a programming language environment (e.g., a code editor). The graphical model and the code may be displayed simultaneously on one or more display devices, where one representation (e.g., the graphical model) is displayed on one display device while another representation (e.g., the code) is displayed on another display device.

However, exemplary embodiments are in no way limited to this particular example or the representations and formalisms used in this example. For example, in some exemplary embodiments, the code may be generated by a code generator based on a corresponding graphical model. In other exemplary embodiments, the code may be used to generate, implement and/or execute a corresponding graphical model (e.g., Embedded MATLAB code in Simulink). In these embodiments, suggestions for modifying the graphical model or the code may be based, for example, on relating interfaces in the code to corresponding graphical model elements. In yet other exemplary embodiments, the code may be equation-based, such as differential and algebraic equation modeling (e.g., Modelica, Simscape, etc.).

Graphical models can be configured and prepared for code generation. Code can be automatically generated from a graphical model for prototype hardware to allow real-time implementation of a system. One use of graphical models capable of automatic code generation is in the design of embedded systems. Embedded system designers can implement a graphical model to operate in real time using automatically-generated code for testing, prototyping and optimization before deployment in the embedded systems. Graphical models capable of automatic code generation thus may reduce development time and costs by enabling the embedded system designers to run real-time simulations with hardware-in-the-loop systems, rapidly prototype ideas on real systems and generate production C code from models.

Figure 2:
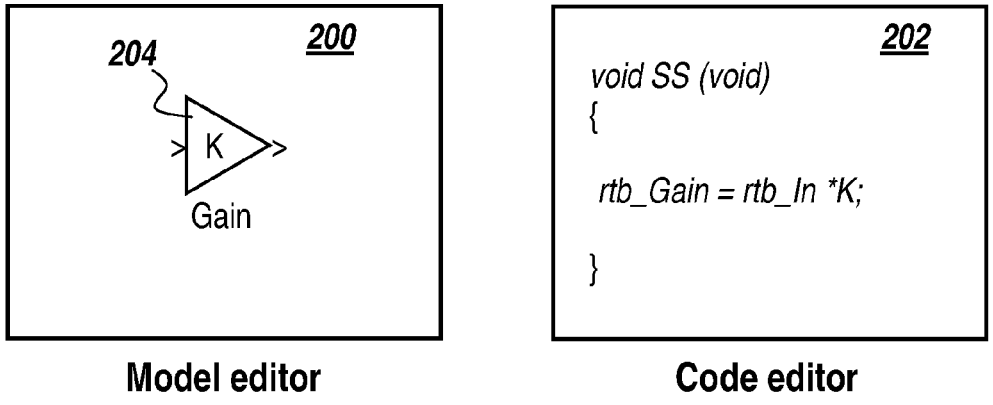
FIG. 2 illustrates a graphical model of a portion of an underlying system presented in a model editor and code associated with the portion of the underlying system presented in a code editor.

FIG. 2 illustrates a graphical model 200 of a portion of an underlying system presented in a model editor and code 202 associated with the portion of the underlying system presented in a code editor. The model editor and the code editor are displayed concurrently on a display device.

The graphical model 200 includes a gain component 204. In general, a gain component receives an input signal at an input port, generates an output signal by imparting a gain of "K" to the input signal and makes the output signal available at an output port. The code 202 is associated with the gain component and includes an outline or skeleton of a function called SS. However, the graphical model 200 only includes the gain component 200, but does not include input or output ports. The interface of the function (void SS(void)) in the code 202 is very basic and does not specify any input or output parameters. The body of the function specifies the gain formula used by the gain component.

Figure 3:
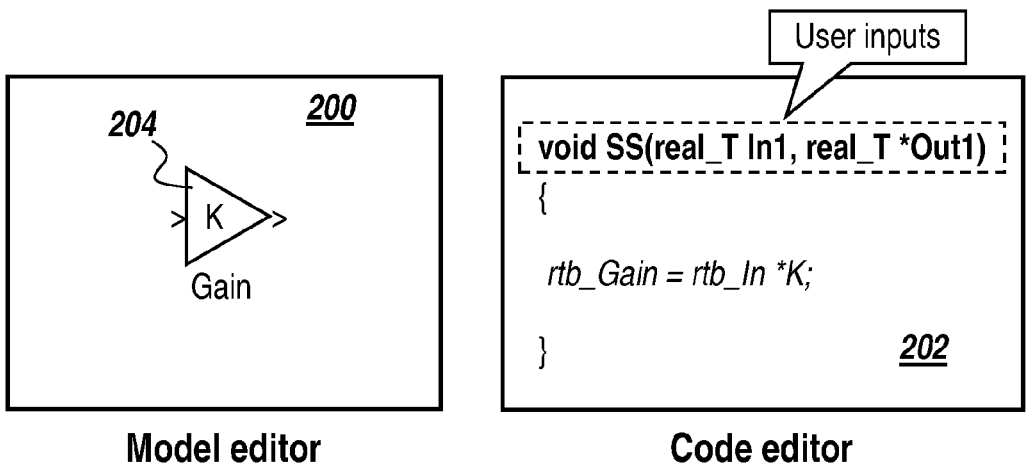
FIG. 3 illustrates user input in the code of FIG. 2.

As illustrated in FIG. 3, a user may replace the basic interface of the function SS with a more specific interface (void SS(real_T In1, real_T*Out1)). The user may edit the function interface in the code 202.

In one embodiment, this user action of replacing the function interface may automatically trigger the process of making one or more suggestions about further editing the graphical model 200 and the code 202. In another embodiment, after replacing the function interface, the user may trigger the process of making one or more suggestions.

Figure 4:
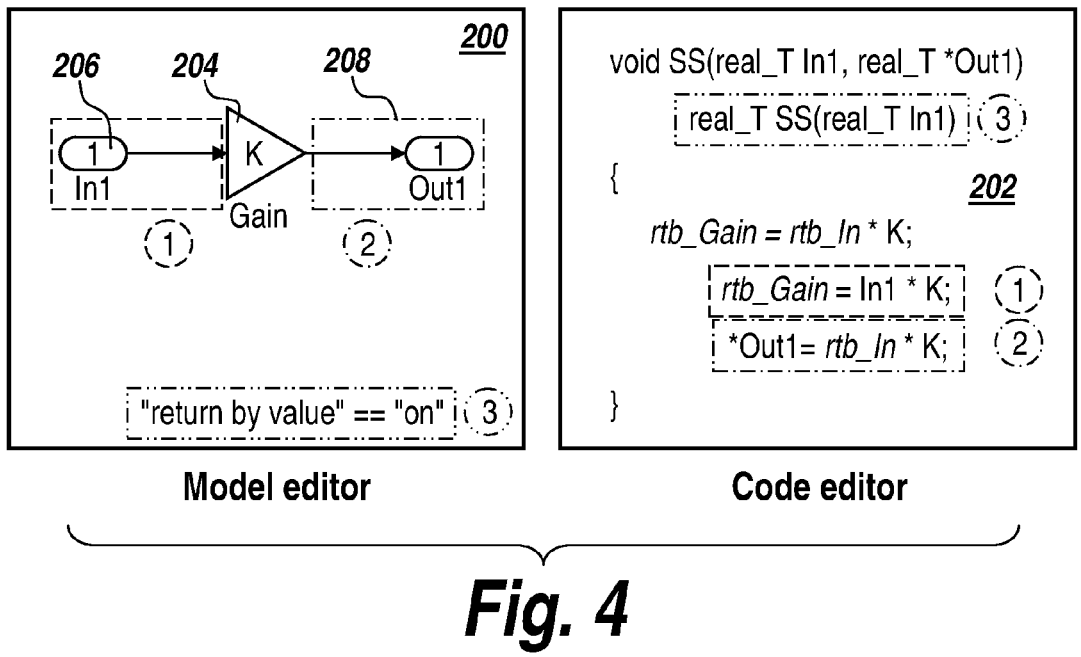
FIG. 4 illustrates first and second sets of suggestions presented in the graphical model and the code of FIG. 3.

Exemplary embodiments may analyze the contents of the graphical model 200 and the code 202, and the formalisms of the model editor and the code editor. Based on this analysis, exemplary embodiments may determine a first set of three suggestions for editing the graphical model 200. Exemplary embodiments may also determine a second set of three suggestions for editing the code 202, in which the suggestions in the second set correspond to the suggestions in the first set. FIG. 4 illustrates the first and second sets of suggestions presented in the graphical model 200 and the code 202 of FIG. 3.

In the first set of suggestions for editing the graphical model 200, a first suggestion "1" includes: (a) adding an input port 206 in the left portion of the graphical model 200, and (b) establishing a linkage between the input port 206 and the gain component 204 in the graphical model 200. If the graphical model 200 includes multiple gain components, the gain component selected for the linkage may be the left-most, the right-most, or any other specific gain component. In the second set of suggestions for editing the code 202, a corresponding first suggestion "1" includes: replacing the existing code with (rtb_Gain=In1*K) at the beginning of the function body in the code 202.

In the first set of suggestions, a second suggestion "2" includes: (a) adding an output port 208 in the right portion of the graphical model 200, and (b) establishing a linkage between the output port 208 and the gain component 204. If the graphical model 200 includes multiple gain components, the gain component selected for the linkage may be the left-most, the right-most, or any other specific gain component. In the second set of suggestions, a corresponding second suggestion "2" includes: replacing the existing code with (*Out1=rtb_In*K) in the function body in the code 202.

In the first set of suggestions, a third suggestion "3" includes: selecting a "return output by return value" option associated with the graphical model 200. In the second set of suggestions, a corresponding third suggestion "3" includes: replacing the function interface (void SS(real_T In1, real_T*Out1)) with an alternative function interface (real_T SS(real_T In1)).

Software and Hardware Targets Example

Exemplary embodiments may also be used to make goal-directed suggestions for representations of an underlying system implemented in different formalisms. That is, the suggestions for editing the representations may be based on satisfying one or more goals. The goals may pertain to the general computing resources used to provide, implement and/or execute the representations of the system. For example, the goals may specify one or more computing resource constraints associated with targets on which the representations are deployed.

This goal-directed suggestion application of exemplary embodiments will now be described with reference to a partitioned model example. However, exemplary embodiments are in no way limited to this particular example or the representations and formalisms used in this example.

Figure 5A:
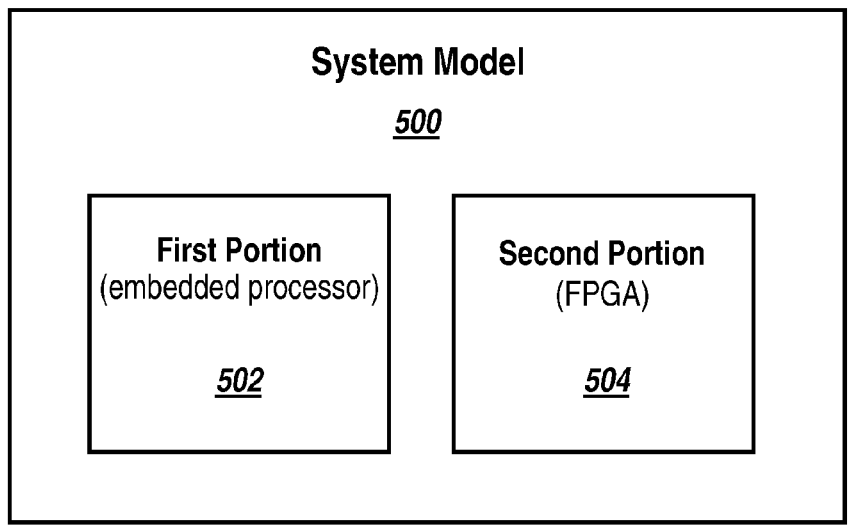
FIG. 5A illustrates a system model with a first portion for which code is deployed on an embedded processor and a second portion for which code is deployed on an FPGA.

In the example, illustrated in FIG. 5A, the underlying system may be represented as a system model 500, e.g., a model of a dynamic system implemented in a modeling environment. Code associated with the model may be partitioned into two or more code portions, each code portion configured for deployment on a different target. For example, a first portion 502 of the model 500 may have a corresponding first code portion that may be configured for software deployment on an embedded processor. A second portion 504 of the model 500 may have a corresponding second code portion that may be configured for deployment on a field programmable gate array (FPGA). In this example, the first code portion corresponds to a first representation which is implemented in the formalism required by the embedded processor (e.g., implemented in embedded C code). The second code portion corresponds to a second representation which is implemented in the formalism required by the FPGA (e.g., implemented in VHDL code).

The targets for the two code portions (the embedded processor and the FPGA) may present different formalisms for describing the syntax and semantics of the code portions. In addition, the targets may present different resource constraints on the code portions. For example, a task on the embedded processor may be triggered at the rate of 10 ms, the system may have an available RAM 4 k, available ROM 10 k, and the FPGA may have 100 k gates available.

Figure 5B:
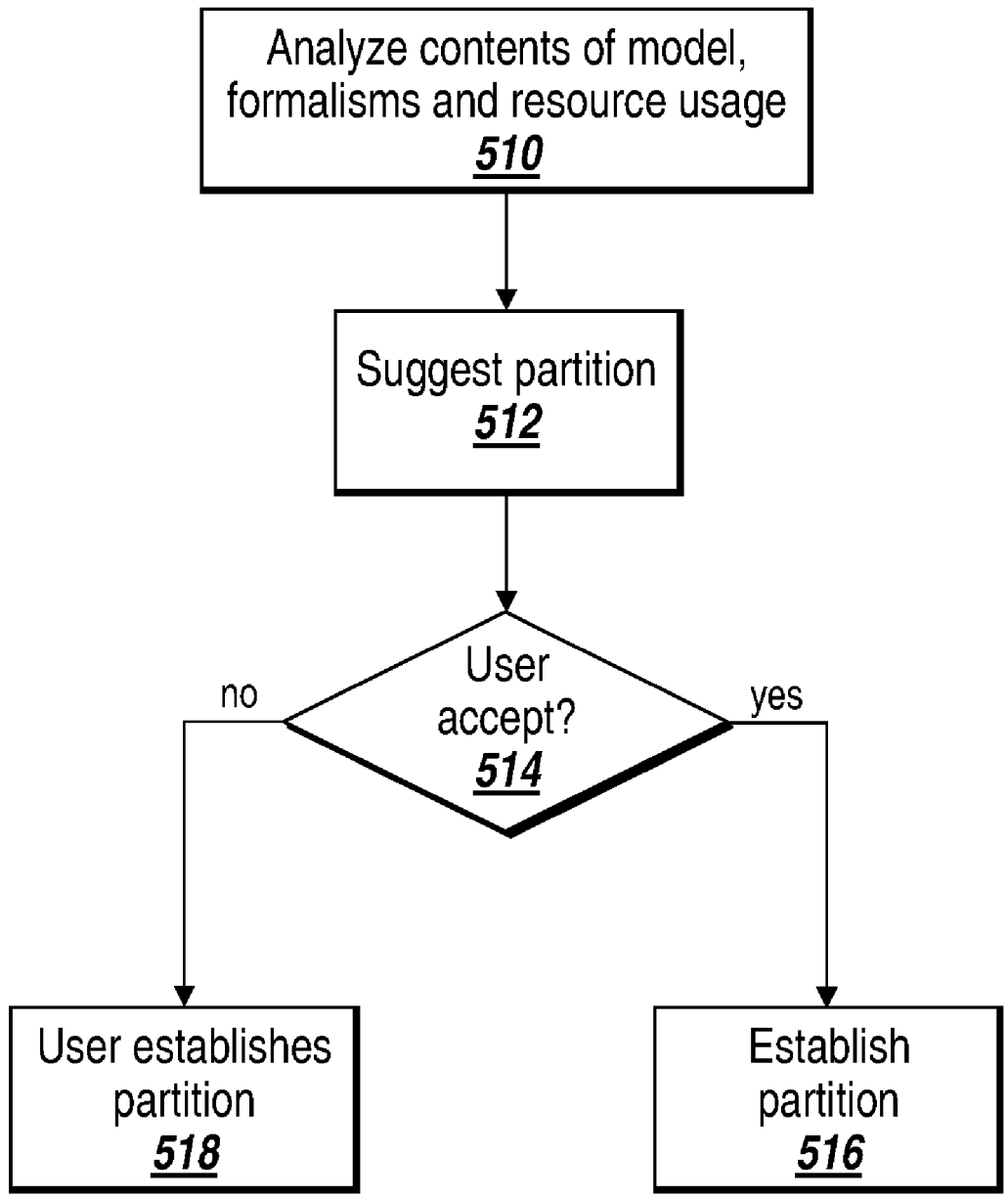
FIG. 5B is a flow chart that illustrates steps for partitioning a model in an exemplary embodiment.

The partition of the code may be based on a goal of minimizing computing resource usage by the targets. As shown in FIG. 5B, inorder to partition the model into the two code portions, exemplary embodiments may analyze the contents of the model, the formalisms presented by the embedded processor (e.g., C programming language) and the FPGA (e.g., VHDL), and computing resource usages by the embedded processor and the FPGA (step 510).

Based on the analysis, exemplary embodiments may suggest a partition that minimizes (e.g., in an optimal partition) one or more computing resources consumed in the embedded processor and FPGA targets, or that consumes less computing resources than another partition (step 512). The user may either accept (see step 514) the partition suggestion (step 516) or manually provide an alternative partition (step 518). Exemplary embodiments may then partition code associated with the model into two code portions, such that the first code portion is implemented as embedded C code for deployment in an embedded processor, and the second sub-model is implemented as VHDL code for deployment in the FPGA. Once the partition is established, exemplary embodiments may concurrently display the first and second code portions on a display device.

As the user interacts with the model of the underlying system, exemplary embodiments may generate suggestions on editing the first and second code portions. For example, if the user adds a new component to the model, exemplary embodiments may generate two suggestions: adding code for the new component to (a) the embedded processor code portion or (b) the FPGA code portion. Exemplary embodiments may also display the impact of accepting either suggestion on the system model and the two code portions, and the impact of accepting either suggestion on the available computing resources. In addition, exemplary embodiments may also display the impact of accepting any suggestion on computing performance, e.g., storage, stack usage, time required in execution, etc.

Upon the user accepting either of the suggestions, exemplary embodiments may add the code for the new component to the accepted code portion, and make any corresponding edits to the model and/or the un-accepted code portion.

Other Formalisms

Exemplary embodiments may be used to make suggestions for modifying representations implemented in other formalisms including, but not limited to, UML formalisms (e.g., message sequence charts, component diagrams, use cases, class diagrams, state charts, activity diagrams), XML schemas, state charts, time-based block diagrams, etc. For example, an XML schema may be analyzed to make modification suggestions in another representation, such as a time-based block diagram.

Generation of Suggestions

Figure 6A:
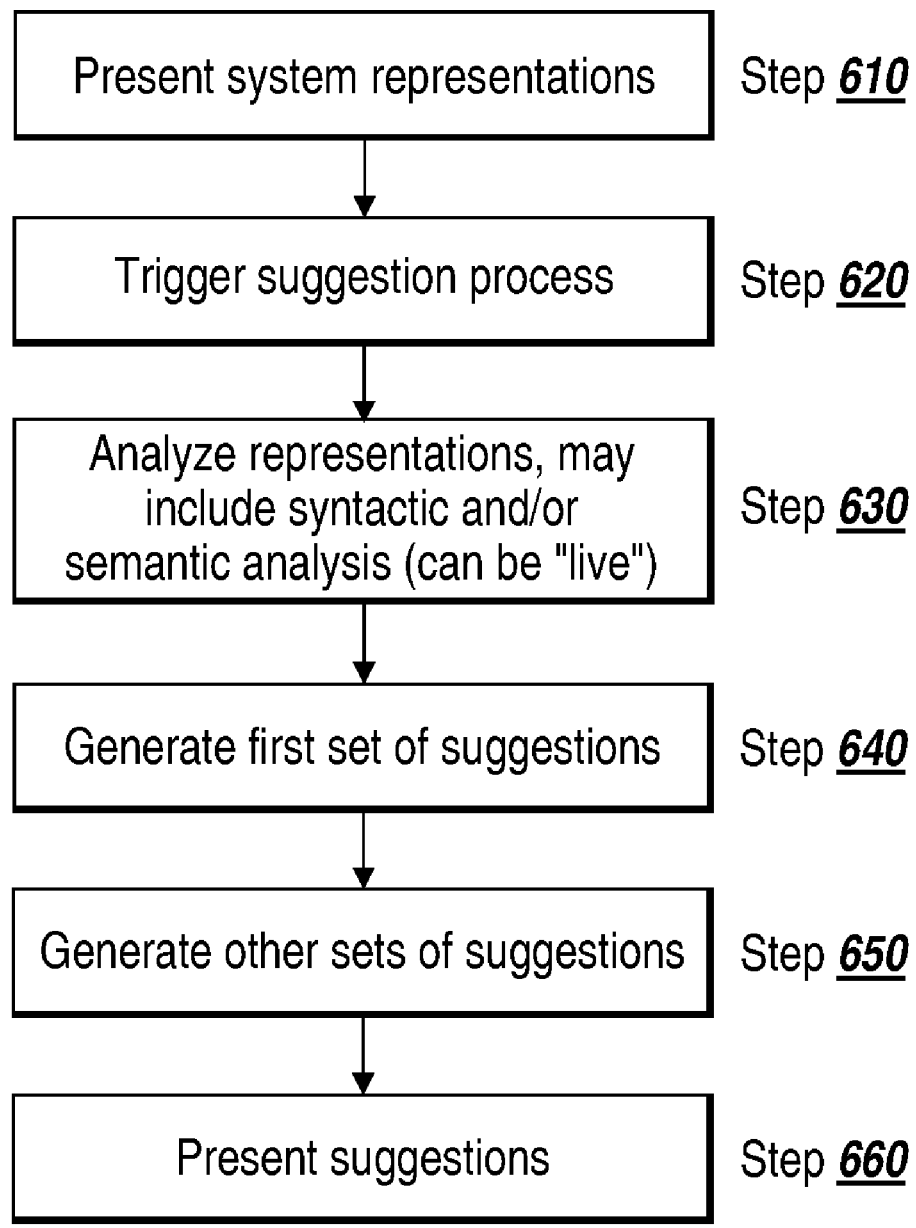
FIG. 6A is a flowchart that illustrates an exemplary process of generating a suggestion in a representation of a system.

FIG. 6A is a flowchart that illustrates an exemplary process of generating a suggestion in a representation of a system. In step 610, exemplary embodiments present two or more representations of the system, e.g., a graphical model of the system presented in a model editor and code associated with the graphical model presented in a code editor, a model implemented in the Unified Modeling Language (UML), etc. In step 620, the process of making a suggestion is triggered. In one embodiment, the process may be triggered automatically, e.g., when a user makes a change in the first representation. In another embodiment, the process may be triggered by the user.

In step 630, exemplary embodiments may analyze the first representation in view of the syntax and semantics of the first formalism in which the first representation is implemented. In step 630, exemplary embodiments may also analyze one or more additional representations of the system in view of the syntax and semantics of the formalisms in which the additional representations are implemented. In the case of a graphical model, this analysis may include, but is not limited to, analysis of the components in the model (e.g., the model includes two gain components), the configuration of the components (e.g., gain component A is the left-most component in the model), any incomplete portions of the model (e.g., gain component A is not connected to any input/output ports), etc. In the case of code, this analysis may include, but is not limited to, analysis of the contents of the code (e.g., the code includes a function interface and a variable declaration), any incomplete portions of the code (e.g., the code does not initialize a necessary variable), etc.

In step 640, exemplary embodiments may process the analysis results of step 630 to generate a first set of suggestions that can be made to the first representation. The first set of suggestions may include one or more suggestions. The suggestions may be generated based on one or more results of the analysis of step 630.

Figure 6B:
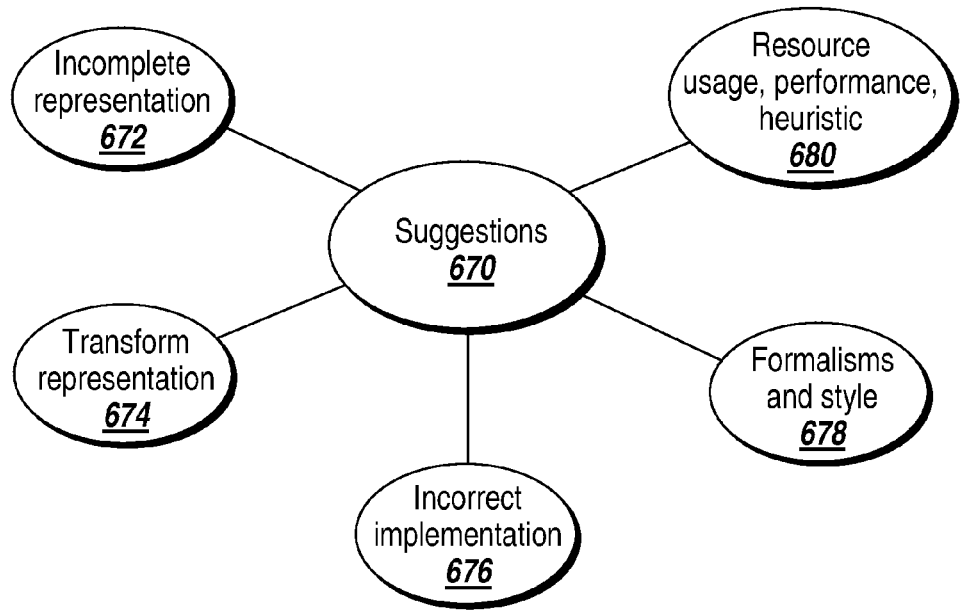
FIG. 6B illustrates exemplary types of suggestions.

FIG. 6B illustrates a number of different types of possible suggestions 670. This illustration is not intended to be exhaustive and other types of suggestions are possible. The analysis results may include a determination that a portion of the representation is incomplete (672 in FIG. 6B), in which case the suggestion would suggest a way of automatically completing that portion. Exemplary embodiments may implement, as one example, a pattern matching system in which an incomplete pattern is mapped to suggested ways of completing the pattern. Exemplary embodiments may also implement, as another example, a rule-based system in which particular rules are triggered when incomplete portions are identified, and in which the particular rules then result in certain suggestions that are made to complete the portions.

Exemplary embodiments may also implement analysis of transformation or rewrite rules that apply to a portion of the representation. The corresponding changes implemented by these rules may be used to suggest modifications or transformations 674 in the representation. Analysis of a representation using any of these techniques may also result in modifications suggested in one or more other representations.

As one example of a transformation or suggestion 674, in the case of a graphical model, if the analysis in step 630 determines that a gain component is not yet connected to input/output portions, exemplary embodiments may suggest automatically creating input/output ports and linking the ports to the gain component. As another example, in the case of code, if the analysis in step 630 determines that the body of a function fails to initialize a necessary variable, exemplary embodiments may suggest automatically initializing the variable. This initialization may be suggested in the corresponding graphical model as an attribute to be set on the appropriate model variable (e.g., a signal in a time-based block diagram).

The analysis results may also include a determination that a portion of the representation is incorrectly implemented. Suggestions 676 may be generated to remedy the incorrect implementation. Exemplary embodiments may implement, as one example, a pattern matching system in which an incorrect pattern is mapped to suggested ways of correcting the pattern. Exemplary embodiments may also implement, as another example, a rule-based system in which particular rules are triggered when incorrect portions are identified, and in which the particular rules then result in certain suggestions 676 that are made to correct the portions. For example, in the case of code corresponding to a gain component, the analysis in step 630 may determine that the function interface for the gain component is incorrect and does not conform to the coding formalism required for a gain component. In this case, exemplary embodiments may suggest automatically editing the function interface. In another example, a code interface may not adhere to a style guideline for the formalism such as, for example, the MISRA coding style for C code or MathWorks Automotive Advisory Board style guidelines for Simulink/Stateflow models. In this case, exemplary embodiments may suggest automatically editing the function interface so that it adheres to a style guideline.

In another embodiment, suggestions 678 to a graphical model representation or the corresponding code representation may be suggested based on coding formalisms, modeling formalisms, or style guides for the other representation. For example, a case/select statement in the graphical model may correspond to code that is lacking a default case. In this case, exemplary embodiments may analyze the code representation, and suggest addition of a default case in the graphical model representation based on the analysis.

The analysis results may further include a determination that a portion of the representation may be replaced to improve performance, resource usage, or other heuristics, see 680. Exemplary embodiments may implement, as one example, a pattern matching system in which a particular pattern found in a representation is mapped to other patterns which may replace the particular pattern. Exemplary embodiments may then analyze the impact of all the patterns on the desired heuristic, and determine if the particular pattern should be replaced by another pattern to improve the heuristic. For example, in the case of a graphical model, the analysis in step 630 may determine that there are multiple cascading gain components. In this case, exemplary embodiments may suggest replacing the gain components with a single gain component with a corresponding gain.

In step 650, corresponding to the first set of suggestions, exemplary embodiments may determine one or more additional sets of suggestions for editing the one or more additional representations. In order to determine a second set of suggestions for a second representation implemented in a second formalism, exemplary embodiments may analyze the second formalism and determine how to map each suggestion in the first set of suggestions to the second formalism. Exemplary embodiments may implement, as one example, a pattern-matching system in which a pattern found in one representation is matched to corresponding patterns in other representations. As one example, a gain component in a graphical model may be matched to a function interface in code corresponding to the gain component. In this case, if a gain component is suggested for inclusion in a graphical model, exemplary embodiments may suggest inclusion of the corresponding function interface in the code corresponding to the graphical model. As another example, cascading gain components in a graphical model may be matched to multiple function interfaces in code corresponding to the gain components. In this case, if the cascading gain components are suggested for replacement with a single gain component in the graphical model, exemplary embodiments may suggest folding the multiple function interfaces into a single function interface in the code.

Some exemplary embodiments may analyze the representations and formalisms and generate the suggestions in a "live" fashion, i.e. concurrently as the user uses or modifies the representations. Other exemplary embodiments may analyze the representations and formalisms and generate the suggestions in a "non-live" fashion, i.e. not concurrently as the user uses or modifies the representations. For example, the suggestions may be generated once the user completes creating or modifying a representation.

Exemplary embodiments may generate suggestions even when one or more representation is incomplete, e.g., a partially complete graphical model.

Each suggestion in the first set of suggestions may map to zero, one or more suggestions in an additional set of suggestions. For example, making a certain edit to the first representation may not necessitate a corresponding edit in a second representation. In this case, the suggestion to make the edit in the first representation may map to zero suggestion in the second representation. Similarly, making a certain edit to the first representation may necessitate making more than one edit in a second representation because of the syntactic and semantic requirements of the second formalism which implements the second representation. In this case, the suggestion to make the edit in the first representation may map to more than one suggestion in the second representation.

In step 660, exemplary embodiments may present the first set of suggestions on the first representation and the one or more additional sets of suggestions on the one or more additional representations. Alternatively, exemplary embodiments may present all sets of suggestions in all the representations.

Figure 6C:
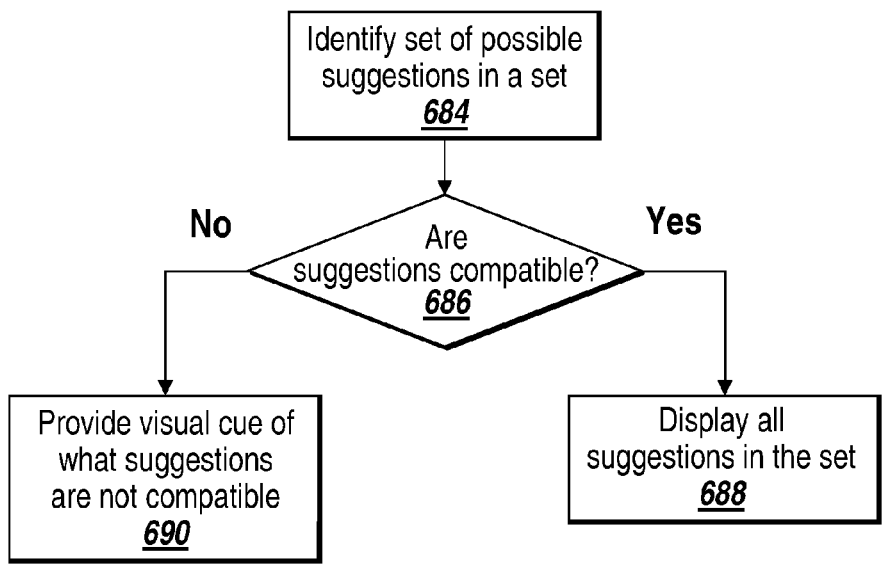
FIG. 6C is a flowchart illustrating steps that are taken to help a user identify incompatible suggestions in a set of suggestions.

In some cases, suggestions in a given set may not be compatible with each other. In exemplary embodiments, feedback is provided to the user regarding incompatibility. FIG. 6C shows the steps that may be performed to this end. First, a set of possible suggestions for a set are identified (step 684). Then a determination is made whether the suggestions are compatible or not (step 686).

One way to determine compatibility in step 686 is to use look up tables. Each suggestion has an entry identifying what other suggestions are incompatible with the suggestion. Alternatively, a function may calculate the compatibility of suggestions at run-time.

If all the suggestions in a set are compatible with each other, the suggestions may be displayed in full color and intensity (step 688) in step 660 of FIG. 6A. However, if not all of the suggestions in a set are compatible, a visual cue may be displayed to identify the incompatibility (step 690 in FIG. 6B). For example, suppose that a set S contains suggestions {S1, S2, S3, S4}. Further, suppose that S1 is not compatible with S2, S3, and S4, and that S2 is compatible with S3 and S4. A visual cue or cues may be provided to indicate the compatibility and incompatibility.

One example of visual cues is that once an indicator, such as a cursor, is directed at a suggestion (for example by positioning the cursor, hovering, over the suggestion), compatible suggestions remain displayed, whereas incompatible suggestions are greyed out or displayed in phantom form. Thus, in the example set from above, if the cursor hovers over suggestion S1, suggestions S2, S3 and S4 are greyed out or displayed in phantom form. In contrast, if the cursor hovers over suggestion S2, suggestions S3 and S4 remain displayed in full color and intensity, but suggestion S1 is greyed out or displayed in phantom form. Alternatively, highlighting can be employed, for example to raise the intensity such as by changing font size or weight, color, etc., of suggestions S3 and S4 when hovering over suggestion S2.

Acceptance of Suggestions

Figure 7:
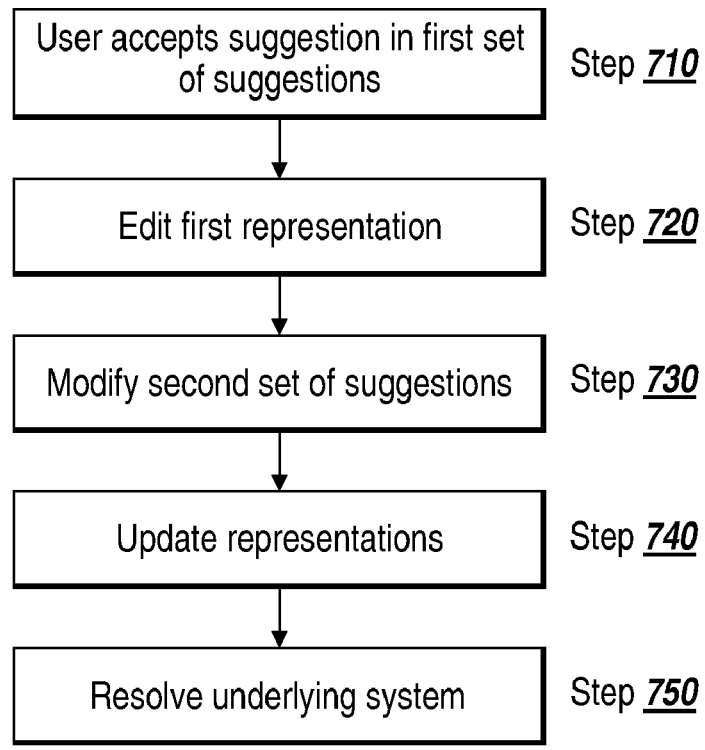
FIG. 7 is a flowchart that illustrates an exemplary process of accepting a suggestion in the representations of a system.

FIG. 7 is a flowchart that illustrates an exemplary process of accepting a suggestion in the representations of a system.

In step 710, a user may indicate acceptance of a certain suggestion in the first set of suggestions presented on the first representation. Exemplary embodiments may provide computer-implemented options which the user may use to indicate acceptance or rejection of a suggestion. These options may include, but are not limited to, a menu-item, left-and-right mouse clicks, keyboard shortcuts, affordances in or near the suggestions displayed to the user, etc.

In step 720, in response to the user's acceptance, exemplary embodiments may edit the first representation based on the accepted suggestion.

The accepted suggestion in the first representation may have zero, one or more corresponding suggestions in the second representation. Thus, the user's acceptance of the accepted suggestion may narrow down the second set of suggestions in the second representation, so that the second set includes only those suggestions that correspond to the accepted suggestion. In step 730, exemplary embodiments may modify the second set of suggestions for the second representation, so that the second set includes only those suggestions that correspond to the accepted suggestion in the first representation.

In one embodiment, if the accepted suggestion in the first representation has a single corresponding suggestion in the second set for the second representation, exemplary embodiments may automatically edit the second representation based on the single suggestion. In exemplary embodiments, the display or presentation of the edited second representation may present the edits distinctively from the unedited portions of the second representation. Alternatively, the edits may be associated with dirty indicators or other affordances. As a specific example, when code corresponding to a model is edited based on an accepted model suggestion, the changed lines of code may be presented on a special background color and/or may be highlighted.

In another embodiment, if all the suggestions in the second set for the second representation correspond to the accepted suggestion in the first representation, the second set of suggestions may not need to be modified at all. In yet another embodiment, if the accepted suggestion in the first representation has no corresponding suggestion in the second set for the second representation, the second set of suggestions may become an empty set. That is, no corresponding suggestions will be made for the second representation. In still other embodiments, the second set of suggestions may be enlarged or narrowed based on the suggestion accepted in the first representation.

In step 740, exemplary embodiments may update the presentation of the representations of the system to reflect the edits. For example, if the representations are displayed simultaneously on a display device, exemplary embodiments may concurrently update the displays to show the edited representations.

In step 750, after editing all the representations of the system that correspond to the accepted suggestion, exemplary embodiments may resolve the underlying system to reflect the editing of the system. Resolving the underlying system may include, for example, updating the description and/or specification of the system that is stored in a computer-readable storage device.

Presentation of Suggestions

Exemplary embodiments may present suggestions for editing a representation distinctively from the content of the representation. This allows a user to quickly distinguish the suggestions from the content of the representation. For example, suggestions may be highlighted in color, presented in a different font color, type or style than the representation, etc. However, suggestions that correspond to each other on different representations may be presented in the same format.

When more than one suggestion is concurrently made on a representation, exemplary embodiments may present different suggestions for editing a representation distinctively from each other. This allows a user to quickly distinguish between different suggestions and to individually accept or reject different suggestions. For example, different suggestions may be highlighted in different colors, numbered, etc. However, suggestions that correspond to each other on different representations may be presented in the same format.

As mentioned previously, FIG. 4 illustrates exemplary displays of suggestions for editing a graphical model and code associated with the graphical model. FIG. 4 illustrates a graphical model 200 (a first representation of a system) and code 202 (a second representation of a system) associated with the graphical model 200. A first suggestion is highlighted in yellow and numbered "1" on both the graphical model and the code; a second suggestion is highlighted in purple and numbered "2" on both the graphical model and the code; and a third suggestion is highlighted in green and numbered "3" on both the graphical model and the code.

Tracking Acceptance of Suggestions

Figure 8A:
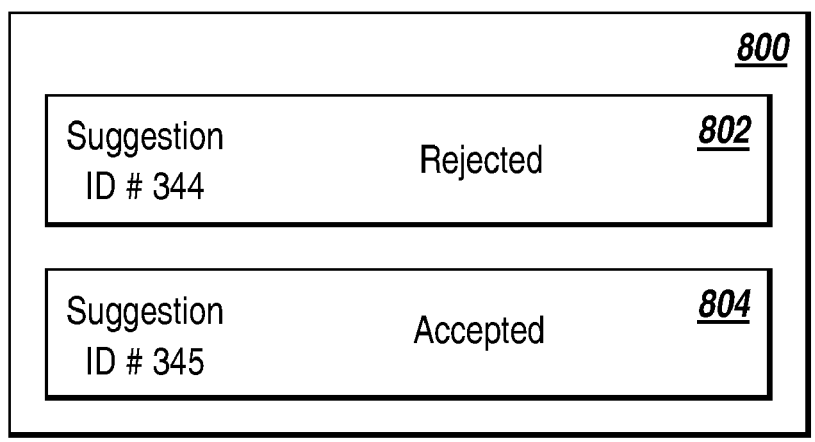
FIG. 8A illustrates an exemplary table in which exemplary embodiments record acceptance and rejection of suggestions.

A user has the choice of accepting or rejecting every suggestion made by exemplary embodiments to edit a representation. Exemplary embodiments may track and record users' acceptance and rejection of suggestions, along with additional information on the user and the types of the suggestions. As illustrated in FIG. 8A, exemplary embodiments may record acceptances and rejections in a table saved on a database 800. Each suggestion is entered as an entry 802, 804 in the table 800, e.g., identified by the type of the suggestion in the type of formalism, an exact description of the suggestion, etc. In each suggestion entry 802, 804, exemplary embodiments may record whether the user accepted or rejected the suggestion. These entries may be recorded and saved in the form of a database, for example.

The additional information may include, but is not limited to, the user's identity (e.g., programmer "Bob Jones"), the user's user group or groups (e.g., "Administrator," "Developer," "Quality Engineer," "Software Engineer," etc.) the type of the suggestion (e.g., adding an input port to a graphical model component, replacing a function interface with an alternative function interface), specific details on the suggestion (e.g., adding an input port to a gain block, replacing the function interface "void SS(real_T In1, real_T Out1)" with the alternative function interface "real_T SS(real_T In1)"), the formalism in which the suggestion was accepted or rejected (e.g., a graphical model editor or a code editor) the specific rule or rules that may have been used to generate the suggestion, a specific pattern or patterns that may have been used to generate the suggestion, other input for generating the suggestion (e.g., which style guides were used).

Exemplary embodiments may calculate statistical information on acceptances and rejections of different suggestions based on the recorded information. As an example, exemplary embodiments may calculate the frequencies with which certain types of suggestions were made (e.g., how often a function interface was suggested to be replaced). As another example, exemplary embodiments may calculate the frequencies with which certain types of suggestions were accepted or rejected (e.g., the suggestion to replace a certain type of function interface was always rejected).

Exemplary embodiments may use this type of determination to automatically adjust the process of generating suggestions so that, for example, it no longer makes a suggestion or type of suggestion that has always been rejected. Exemplary embodiments may also use information on the user to adjust the process of generating suggestions so that, a user's past preferences on a particular suggestion are used to determine whether to make that suggestion in the future. Exemplary embodiments may also obtain user approval before automatically adjusting the process of generating suggestions.

Figure 8B:
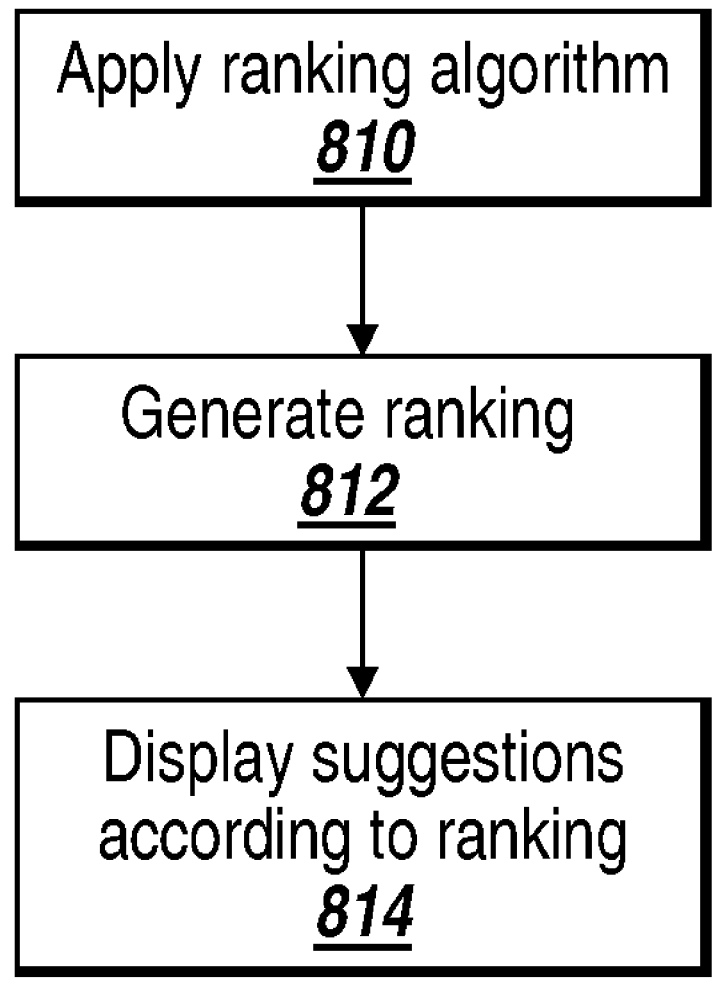
FIG. 8B illustrates a flowchart of steps taken to employ rankings to suggestions.

Rankings of suggestions may be employed. FIG. 8B illustrates the steps that are performed to employ rankings. First, a ranking algorithm is applied to possible suggestions (step 810). The ranking algorithm may be a heuristic. The rankings are generated from application of the algorithm (step 812). The suggestions are then presented according to the rankings (step 814).

Exemplary embodiments may use this type of determination to rank future suggestions based on the user's history of accepting or rejecting prior suggestions. That is, in a future set of suggestions, the suggestions can be ranked in a descending order based on the probability that the user will accept each suggestion.

Furthermore, exemplary embodiments may also rank suggestions in a set of suggestions based on performance heuristics, e.g., the impact of each suggestion on computing performance or computing resources used.

Furthermore, exemplary embodiments may also rank suggestions in a set of suggestions based on changes to the representation, e.g., the impact of each suggestion on the number of resulting changes in the representations, where these changes may be assigned a cumulative value based on a weighting scheme (e.g., changes to the argument list of a function may be assigned a higher weight than adding a line of code).

Exemplary Computing Device

The computing environment 100 (FIG. 1) may be provided on a single computing device, as described below with reference to FIG. 9, on multiple computing devices (e.g., in a distributed configuration, a computing cloud, as a service, etc.), and/or in other configurations (e.g., a multi-core implementation operating on one or more platforms).

Figure 9:
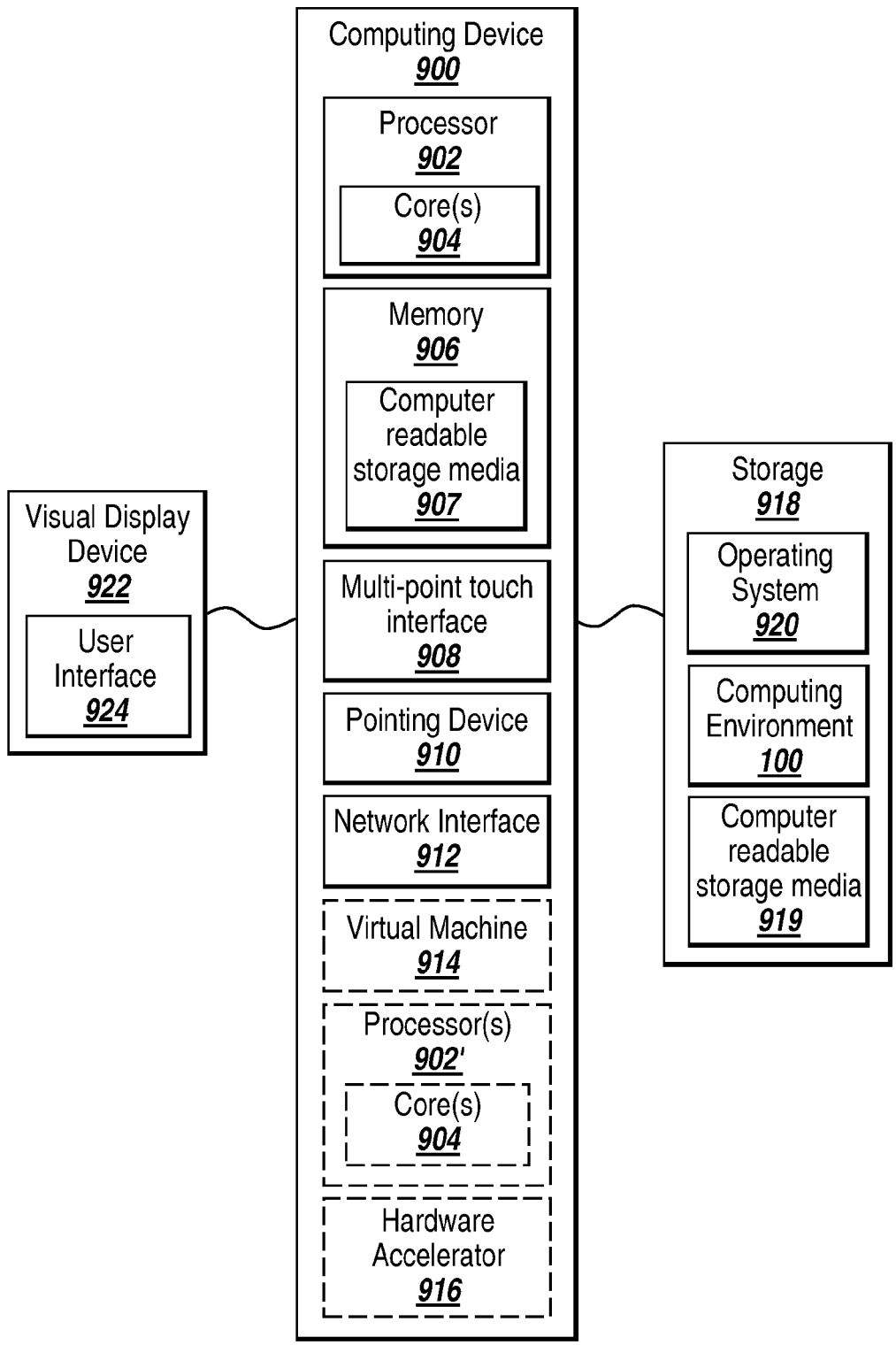
FIG. 9 illustrates an exemplary computing device that may be configured to practice exemplary embodiments.

FIG. 9 is an exemplary computing device 900 that may be configured to practice exemplary embodiments. The implementation of FIG. 9 is illustrative and may take other forms. For example, an alternative implementation of the computing device 900 may have fewer components, more components, or components that are in a configuration that differs from the configuration of FIG. 9. The components of FIG. 9 and/or other figures described herein may be implemented in hardware-based logic, software-based logic and/or a combination of hardware and software-based logic (e.g., hybrid logic). The components of FIG. 9 and/or other figures are not limited to a specific type of logic.

The computing device 900 may take many forms, including but not limited to, a computer, workstation, server, network computer, quantum computer, optical computer, Internet appliance, smart phone, mobile device, a pager, a tablet computer, a smart sensor, application specific processing device, etc.

The computing device 900 may include one or more computer-readable storage media for storing one or more computer-executable instructions or software for implementing exemplary embodiments. For example, memory 906 included in the computing device 900 may store computer-executable instructions or software, e.g., instructions for implementing and processing the modules in the computing environment 100. The one or more computer-readable media may also be provided separately from the computing device 900.

The computing device 900 may include a processor 902 and one or more processor(s) 902' for processing and executing software stored in the memory 906 and other programs for controlling system hardware. Processor 902 and processor(s) 902' each may be a single core processor or multiple core (904 and 904') processor, and may include a central processing unit (CPU).

Virtualization may be employed in the computing device 900 so that infrastructure and resources in the computing device can be shared dynamically. Virtualized processors may also be used with an application or software in storage 918. A virtual machine 914 may be provided to handle a process running on multiple processors so that the process appears to be using only one computing resource rather than multiple resources. Multiple virtual machines may also be used with one processor. Other computing resources, such as field-programmable gate arrays (FPGA), application specific integrated circuit (ASIC), digital signal processor (DSP), Graphics Processing Unit (GPU), and general-purpose processor (GPP), may also be used for executing code and/or software. A hardware accelerator 916, such as implemented in an ASIC, FPGA, or the like, may additionally be used to speed up the general processing rate of the computing device 900.

The memory 906 may comprise a computer system memory or random access memory, such as dynamic random access memory (DRAM), static random access memory (SRAM), extended data output random access memory (EDO RAM), etc. The memory 906 may comprise other types of memory as well, or combinations thereof.

A programmer may interact with the computing device 900 through an output means like a visual display device 922, such as a computer monitor, which may display any outputs, displays, files, user interfaces, etc, provided in exemplary embodiments. The visual display device 922 may also display other aspects or elements of exemplary embodiments, e.g., databases, code analysis results, etc. The computing device 900 may include other input/output (I/O) devices, such as a keyboard or a multi-point touch interface 908 and a pointing device 910, for example a mouse, for receiving input from a programmer. The multi-point touch interface 908 and the pointing device 910 may be connected to the visual display device 922. The computing device 900 may include other suitable I/O peripherals.

The computing device 900 may further comprise a storage device 918, such as a hard-drive, CD-ROM, or other computer readable media, for storing an operating system 920 and other related software, and for storing the computing environment 100, such as the MATLAB programming environment.

The computing device 900 may include a network interface 912 to interface with a Local Area Network (LAN), Wide Area Network (WAN) or the Internet through a variety of connections including, but not limited to, standard telephone lines, LAN or WAN links (e.g., 802.11, 802.16, T1, T3, 56 kb, X.25), broadband connections (e.g., ISDN, Frame Relay, ATM), wireless connections, controller area network (CAN), or some combination of any or all of the above. The network interface 912 may comprise a built-in network adapter, network interface card, personal computer memory card international association (PCMCIA) network card, card bus network adapter, wireless network adapter, universal serial bus (USB) network adapter, modem or any other device suitable for interfacing the computing device 900 to any type of network capable of communication and performing the operations described herein.

Moreover, the computing device 900 may be any computer system such as a workstation, desktop computer, server, laptop, handheld computer or other form of computing or telecommunications device that is capable of communication and that has sufficient processor power and memory capacity to perform the operations described herein.

The computing device 900 may run an operating system, such as any of the versions of the Microsoft® Windows® operating systems, different releases of the Unix and Linux operating systems, any version of the MacOS® for Macintosh computers, any embedded operating system, any realtime operating system, any open source operating system, any proprietary operating system, any operating systems for mobile computing devices, or any other operating system capable of running on the computing device and performing the operations described herein. The operating system may be running in native mode or emulated mode.

Exemplary embodiments may be provided as one or more computer-executable programs embodied on or in one or more computer-readable storage media. These media may be part 907 of memory 906 and/or part 919 of storage 918. The mediums may be, but are not limited to, a hard disk, a compact disc, a digital versatile disc, a flash memory card, a programmable read only memory (PROM), a random access memory (RAM), a read only memory (ROM), magnetoresistive random access memory (MRAM), a magnetic tape, etc. In general, the computer-executable programs may be implemented in any programming language. Some examples of programming languages that may be used include the MATLAB software, Python, FORTRAN, C, C++, C#, Java, Javascript etc. Furthermore, the computer-executable programs may be implemented in a hardware description language (HDL) or any other language that allows prescribing computations, such as Deoxyribonucleic acid (DNA). The computer-executable programs may be stored on or in one or more mediums as object code.

Exemplary Distributed System

Figure 10:
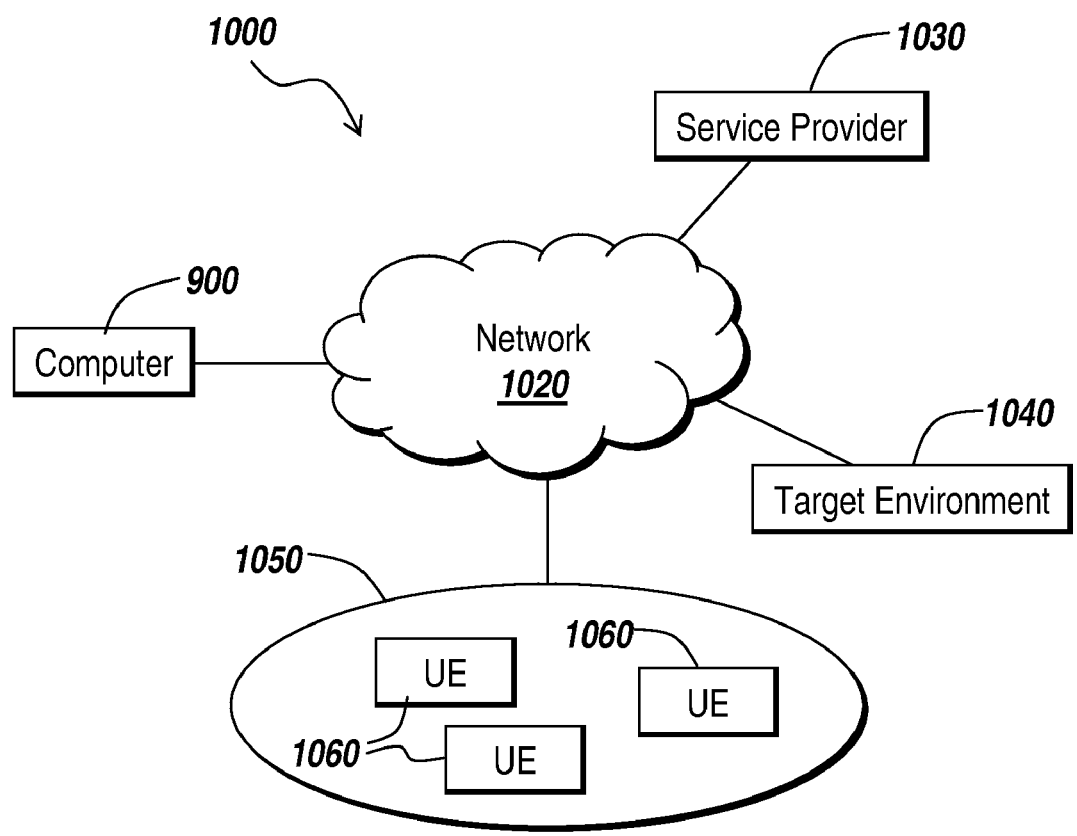
FIG. 10 illustrates an exemplary distributed implementation of exemplary embodiments.

FIG. 10 illustrates an exemplary distributed implementation of exemplary embodiments. System 1000 may include the computer 900, a network 1020, a service provider 1030, a target environment 1040, and a cluster 1050. The embodiment of FIG. 10 is exemplary, and other embodiments may include more devices, fewer devices, or devices in arrangements that differ from the arrangement of FIG. 10.

The network 1020 may transport data from a source to a destination. Embodiments of the network 1020 may use network devices, such as routers, switches, firewalls, and/or servers (not shown) and connections (e.g., links) to transport data. "Data," as used herein, may refer to any type of machine-readable information having substantially any format that may be adapted for use in one or more networks and/or with one or more devices (e.g., computer 900, service provider 1030, etc.). Data may include digital information or analog information. Data may further be packetized and/or non-packetized.

The network 1020 may be a hardwired network using wired conductors and/or optical fibers and/or may be a wireless network using free-space optical, radio frequency (RF), and/or acoustic transmission paths. In an exemplary implementation, the network 1020 may be a substantially open public network, such as the Internet. In another exemplary implementation, the network 1020 may be a more restricted network, such as a corporate virtual network. The network 1020 may include Internet, intranet, LAN, WAN, metropolitan area network (MAN), wireless network (e.g., using IEEE 802.11, Bluetooth, etc.), etc. The network 1020 may use middleware, such as common object request broker architecture (CORBA) or distributed component object model (DCOM). Implementations of networks and/or devices operating on networks described herein are not limited to any particular data type, protocol, architecture/configuration, etc.

The service provider 1030 may include a device that makes a service available to another device. For example, the service provider 1030 may include an entity (e.g., an individual, a corporation, an educational institution, a government agency, etc.) that provides one or more services to a destination using a server and/or other devices. These services may include instructions that are executed by a destination to perform an operation. Alternatively, a service may include instructions that are executed on behalf of a destination to perform an operation on the destination's behalf.

The target environment 1040 may include a device that receives information over the network 1020. For example, the target environment 1040 may be a device that receives user input from the computer 900 for providing non-literal representations of code.

The cluster 1050 may include a number of units of execution (UEs) 1060, and may perform processing on behalf of the computer 900 and/or another device, such as the service provider 1030. For example, in an exemplary embodiment, the cluster 1050 may perform parallel processing on an operation received from the computer 900. The cluster 1050 may include UEs 1060 that reside on a single device or chip or that reside on a number of devices or chips.

Exemplary embodiments may be provided integrally with an existing integrated development environment (IDE). Exemplary embodiments may also be provided as a stand-alone application.

Exemplary embodiments may be provided in a text-based technical computing environment that may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. The text-based technical computing environment may support one or more commands that support remote processing using one or more UEs 1060.

Exemplary embodiments may also be provided in a graphically-based technical computing environment that may be implemented using products such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment. The graphically-based technical computing environment may support remote processing using one or more UEs 1060.

The foregoing description of exemplary embodiments provides illustration and description, but is not intended to be exhaustive or to limit the invention to the precise form disclosed. Modifications and variations are possible in light of the above teachings or may be acquired from practice of the invention. Further, non-dependent acts may be performed in parallel.

In addition, implementations consistent with principles of the invention may be implemented using devices and configurations other than those illustrated in the figures and described in the specification, without departing from the spirit of the invention. Devices and/or components may be added and/or removed from the implementations of the figures depending on specific deployments and/or applications. Also, disclosed implementations may not be limited to any specific combination of hardware.

Furthermore, certain portions of the invention may be implemented as logic that performs one or more functions. This logic may include hardware, such as hardwired logic, an application-specific integrated circuit, a field programmable gate array, a microprocessor, software, wetware, or a combination of hardware and software.

No element, act, or instruction used in the description of the invention should be construed critical or essential to the invention unless explicitly described as such. Also, as used herein, the article "a" is intended to include one or more items. Where only one item is intended, the term "a single" or similar language is used. In addition, the phrase "based on," as used herein, is intended to mean "based, at least in part, on" unless explicitly stated otherwise.

The scope of the invention is defined by the claims and their equivalents.

What is claimed is:

1. One or more computer-readable storage media storing computer-executable instructions that when executed on a computer perform a method of modifying a system representation, the media storing one or more instructions for:
    simultaneously providing, using the computer:
        a first representation of a system, and
        a second representation of the system;
    receiving a user action associated with the first or second representation;
    analyzing:
        the first representation, and
        the second representation;
    automatically determining, using the computer, a first set of modifications for modifying one of the first or second representation, the first set of modifications determined:
        live
        based on the user action, and
        based on the analyzing;
    displaying, on a display device, the first set of modifications within the one of the first or second representation; and
    automatically determining a second set of modifications to be made in the unmodified one of the first or second representation based on the first set of modifications.

2. The computer-readable storage media of claim 1, wherein the one or more instructions further comprise instructions for:
    modifying the one of the first or second representations based on a first subset of the first set of modifications upon a user action indicating approval of the first subset of the first set of modifications; and
    automatically modifying the second set of modifications to be made in the unmodified one of the first or second representation based on the first subset of the first set of modifications.

3. The computer-readable storage media of claim 2, wherein the one or more instructions further comprise instructions for:
    modifying the unmodified one of the first or second representation based on a second subset of the second set of modifications.

4. The computer-readable storage media of claim 2, wherein the one or more instructions further comprise instructions for:
    tracking the user action indicating approval of the first subset of the first set of modifications; and
    accounting for the user action in automatically determining future modifications of the first and/or second representations.

5. The computer-readable storage media of claim 1, wherein the number of modifications in the first set of modifications differs from the number of modifications in the second set of modifications.

6. One or more computer-readable storage media storing computer-executable instructions that when executed on a computer perform a method of modifying a system representation, the media storing one or more instructions for:
    simultaneously providing, using the computer:
        a first representation of a system, and
        a second representation of the system;
    receiving a user action associated with the first or second representation;
    analyzing:
        the first representation, and
        the second representation;
    automatically determining, using the computer, a first set of modifications for modifying one of the first or second representation, the first set of modifications determined:
        live
        based on the user action, and
        based on the analyzing;
    displaying, on a display device, the first set of modifications within the one of the first or second representation; and
    ranking modifications in the first set of modifications.

7. One or more computer-readable storage media storing computer-executable instructions that when executed on a computer perform a method of modifying a system representation, the media storing one or more instructions for:
    simultaneously providing, using the computer:
        a first representation of a system, and
        a second representation of the system;

receiving a user action associated with the first or second representation;
analyzing:
the first representation, and
the second representation;
automatically determining, using the computer, a first set of modifications for modifying one of the first or second representation, the first set of modifications determined:
live
based on the user action, and
based on the analyzing;
displaying, on a display device, the first set of modifications within the one of the first or second representation; and
wherein the first set of modifications is determined while the first and/or second representations of the system are incomplete.

8. One or more computer-readable storage media storing computer-executable instructions that when executed on a computer perform a method of modifying a system representation, the media storing one or more instructions for:
simultaneously providing, using the computer:
a first representation of a system, and
a second representation of the system;
receiving a user action associated with the first or second representation;
analyzing:
the first representation, and
the second representation;
automatically determining, using the computer, a first set of modifications for modifying one of the first or second representation, the first set of modifications determined:
live
based on the user action, and
based on the analyzing;
displaying, on a display device, the first set of modifications within the one of the first or second representation; and
the first representation is one of:
a graphical model of the system implemented in a graphical modeling environment, and
code related to the system implemented in a text-based environment; and
the second representation is the other of:
the graphical model of the system, and
the code related to the system.

9. The computer-readable storage media of claim 8, wherein the user action includes:
entry of code in the second representation.

10. The computer-readable storage media of claim 8, wherein the analyzing includes:
analyzing components and/or configuration of the first representation.

11. The computer-readable storage media of claim 8, wherein the analyzing includes:
performing syntactic and/or semantic analysis of the second representation.

12. One or more computer-readable storage media storing computer-executable instructions that when executed on a computer perform a method of modifying a system representation, the media storing one or more instructions for:
simultaneously providing, using the computer:
a first representation of a system, and
a second representation of the system;
receiving a user action associated with the first or second representation;
analyzing:
the first representation, and
the second representation;
automatically determining, using the computer, a first set of modifications for modifying one of the first or second representation, the first set of modifications determined:
live
based on the user action, and
based on the analyzing;
displaying, on a display device, the first set of modifications within the one of the first or second representation; and
wherein the first set of modifications is determined to satisfy a performance goal or a resource constraint.

13. One or more computer-readable storage media storing computer-executable instructions that when executed on a computer perform a method of modifying a system representation, the media storing one or more instructions for:
simultaneously providing, using the computer:
a first representation of a system, and
a second representation of the system;
receiving a user action associated with the first or second representation;
analyzing:
the first representation, and
the second representation;
automatically determining, using the computer, a first set of modifications for modifying one of the first or second representation, the first set of modifications determined:
live
based on the user action, and
based on the analyzing;
displaying, on a display device, the first set of modifications within the one of the first or second representation; and
determining what modifications in the first set of modifications are compatible with each other.

14. The computer-readable storage media of claim 13, wherein the displaying:
provides a visual cue of what modifications in the first set of modifications are compatible with each other.

15. One or more non-transitory computer-readable storage media storing computer-executable instructions that when executed on a computer perform a method of modifying a system representation, the media storing one or more instructions for:
simultaneously providing, using the computer:
a graphical model implemented in a graphical modeling environment, and
code related to the graphical model implemented in a text-based environment;
receiving a user action associated with the graphical model and/or the code;
analyzing the graphical model and the code related to the graphical model;
automatically determining, using the computer, a first set of modifications for modifying one of the graphical model or the code, the first set of modifications determined live with the providing of the graphical model and the code, the first set of modifications determined based on the user action and based on the analyzing; and
displaying, on a display device, the first set of modifications within the one of the graphical model or the code.

16. The computer-readable storage media of claim 15, wherein the one or more instructions further comprise instructions for:

automatically determining a second set of modifications to be made in the unmodified one of the graphical model or the code based on the first set of modifications.

17. The computer-readable storage media of claim 16, wherein the one or more instructions further comprise instructions for:
  modifying the one of the graphical model or the code based on a first subset of first set of modifications upon a user action indicating approval of the first subset of the first set of modifications; and
  automatically modifying the second set of modifications to be made in the unmodified one of the graphical model or the code based on the first subset of the first set of modifications.

18. The computer-readable storage media of claim 17, wherein the one or more instructions further comprise instructions for:
  modifying the unmodified one of the graphical model or the code based on a second subset of the second set of modifications.

19. The computer-readable storage media of claim 15, wherein the first set of modifications is determined while the graphical model or the code is incomplete.

20. The computer-readable storage media of claim 15, wherein the user action includes:
  editing of the code.

21. The computer-readable storage media of claim 15, wherein the analysis includes:
  analyzing components and/or configuration of the graphical model.

22. The computer-readable storage media of claim 15, wherein the analyzing includes:
  performing syntactic and/or semantic and/or style guideline analysis of the graphical model.

23. The computer-readable storage media of claim 15, wherein the analyzing includes:
  performing syntactic and/or semantic and/or style guideline analysis of the code.

24. The computer-readable storage media of claim 15, wherein the first set of modifications is determined to satisfy a performance goal or a resource constraint.

25. One or more non-transitory computer-readable storage media storing computer-executable instructions that when executed on a computer partition a model, the media storing one or more instructions for:
  accessing a model implemented in a modeling environment, the accessing performed using the computer;
  automatically determining, using the computer, a partition of the model, the partition for use in partitioning the model into a first sub-model for a first deployment type and a second sub-model for a second deployment type, the partition satisfying a performance goal or a resource constraint on the overall model;
  displaying, on a display device, the partition within the model; and
  partitioning, using the computer, the model into the first and second sub-models based on the partition.

26. The computer-readable storage media of claim 25, wherein the first sub-model is deployed on a software target and the second sub-model is deployed on a programmable hardware target.

27. A computer-implemented method for modifying a system representation, the method comprising:
  simultaneously providing, using the computer:
    a first representation of a system, and
    a second representation of the system;
  receiving a user action associated with the first or second representation;
  analyzing:
    the first representation, and
    the second representation;
  automatically determining, using the computer, a first set of modifications for modifying one of the first or second representation, the first set of modifications determined:
    live
    based on the user action, and
    based on the analyzing;
  displaying, on a display device, the first set of modifications within the one of the first or second representation; and
  automatically determining a second set of modifications to be made in the unmodified one of the first or second representation based on the first set of modifications.

28. The method of claim 27, further comprising:
  modifying the one of the first or second representations based on a first subset of the first set of modifications upon a user action indicating approval of the first subset of the first set of modifications; and
  automatically modifying the second set of modifications to be made in the unmodified one of the first or second representation based on the first subset of the first set of modifications.

29. The method of claim 28, further comprising:
  modifying the unmodified one of the first or second representation based on a second subset of the second set of modifications.

30. The method of claim 28, further comprising:
  tracking the user action indicating approval of the first subset of the first set of modifications; and
  accounting for the user action in automatically determining future modifications of the first and/or second representations.

31. The method of claim 27, wherein the number of modifications in the first set of modifications differs from the number of modifications in the second set of modifications.

32. A computer-implemented method for modifying a system representation, the method comprising:
  simultaneously providing, using the computer:
    a first representation of a system, and
    a second representation of the system;
  receiving a user action associated with the first or second representation;
  analyzing:
    the first representation, and
    the second representation;
  automatically determining, using the computer, a first set of modifications for modifying one of the first or second representation, the first set of modifications determined:
    live
    based on the user action, and
    based on the analyzing;
  displaying, on a display device, the first set of modifications within the one of the first or second representation; and
  ranking modifications in the first set of modifications based on heuristics.

33. A computer-implemented method for modifying a system representation, the method comprising:
  simultaneously providing, using the computer:
    a first representation of a system, and
    a second representation of the system;
  receiving a user action associated with the first or second representation;

analyzing:
the first representation, and
the second representation;
automatically determining, using the computer, a first set of modifications for modifying one of the first or second representation, the first set of modifications determined:
live
based on the user action, and
based on the analyzing;
displaying, on a display device, the first set of modifications within the one of the first or second representation; and
wherein the first set of modifications is determined while the first and/or second representations of the system are incomplete.

34. A computer-implemented method for modifying a system representation, the method comprising:
simultaneously providing, using the computer:
a first representation of a system, and
a second representation of the system;
receiving a user action associated with the first or second representation;
analyzing:
the first representation, and
the second representation;
automatically determining, using the computer, a first set of modifications for modifying one of the first or second representation, the first set of modifications determined:
live
based on the user action, and
based on the analyzing;
displaying, on a display device, the first set of modifications within the one of the first or second representation; and
the first representation is one of:
a graphical model of the system implemented in a graphical modeling environment, and
code related to the system implemented in a text-based environment; and
the second representation is the other of:
the graphical model of the system, and
the code related to the system.

35. The method of claim 34, wherein the user action includes:
entry of code in the second representation.

36. The method of claim 34, wherein the analyzing includes:
analyzing components and/or configuration of the first representation.

37. The method of claim 34, wherein the analyzing includes:
performing syntactic and/or semantic and/or style guideline analysis of the second representation.

38. The method of claim 34, wherein the first set of modifications is determined to satisfy a performance goal or a resource constraint.

39. A computer-implemented method for modifying a system representation, the method comprising:
simultaneously providing, using the computer:
a graphical model implemented in a graphical modeling environment, and
code related to the graphical model implemented in a text-based environment;
receiving a user action associated with the graphical model and/or the code;
analyzing the graphical model and the code related to the graphical model;
automatically determining, using the computer, a first set of modifications for modifying one of the graphical model or the code, the first set of modifications determined live with the providing of the graphical model and the code, the first set of modifications determined based on the user action and based on the analyzing; and
displaying, on a display device, the first set of modifications within the one of the graphical model or the code.

40. The method of claim 39, further comprising:
automatically determining a second set of modifications to be made in the unmodified one of the graphical model or the code based on the first set of modifications.

41. The method of claim 40, further comprising:
modifying the one of the graphical model or the code based on a first subset of first set of modifications upon a user action indicating approval of the first subset of the first set of modifications; and
automatically modifying the second set of modifications to be made in the unmodified one of the graphical model or the code based on the first subset of the first set of modifications.

42. The method of claim 41, further comprising:
modifying the unmodified one of the graphical model or the code based on a second subset of the second set of modifications.

43. The method of claim 39, wherein the first set of modifications is determined while the graphical model or the code is incomplete.

44. The method of claim 39, wherein the user action includes:
editing of the code.

45. The method of claim 39, wherein the analyzing includes:
analyzing components and/or configuration of the graphical model.

46. The method of claim 39, wherein the analyzing includes:
performing syntactic and/or semantic and/or style guideline analysis of the graphical model.

47. The method of claim 39, wherein the analysis includes:
performing syntactic and/or semantic and/or style guideline analysis of the code.

48. The method of claim 39, wherein the first set of modifications is determined to satisfy a performance goal or a resource constraint.

49. A computer-implemented method for partitioning a model, the method comprising:
accessing a model implemented in a modeling environment, the accessing performed using the computer;
automatically determining, using the computer, a partition of the model, the partition for use in partitioning the model into a first sub-model for a first deployment type and a second sub-model for a second deployment type, the partition satisfying a performance goal or a resource constraint on the overall model;
displaying, on a display device, the partition within the model; and
partitioning, using the computer, the model into the first and second sub-models based on the partition.

50. The method of claim 49, wherein the first sub-model is deployed on a software target and the second sub-model is deployed on a programmable hardware target.

* * * * *